United States Patent [19]
George

[11] Patent Number: 5,137,047
[45] Date of Patent: Aug. 11, 1992

[54] DELIVERY OF REACTIVE GAS FROM GAS PAD TO PROCESS TOOL

[76] Inventor: Mark George, 23 N. 12th St., Allentown, Pa. 18102

[21] Appl. No.: 572,834

[22] Filed: Aug. 24, 1990

[51] Int. Cl.⁵ .................. B08B 9/02; B08B 9/06
[52] U.S. Cl. .................... 137/240; 55/62; 55/74; 141/85; 141/89; 222/148
[58] Field of Search .................. 137/238, 240; 134/166 C, 167 C, 168 C, 169 C; 222/148; 55/62, 74; 141/4, 5, 8, 11, 85, 89; 15/304

[56] References Cited

U.S. PATENT DOCUMENTS

| | | | |
|---|---|---|---|
| 2,872,397 | 2/1959 | Kiffer | 55/62 |
| 3,029,575 | 4/1962 | Eng et al. | 55/62 |
| 3,226,914 | 1/1966 | Griesmer et al. | 55/62 |
| 3,279,153 | 10/1966 | Basmadjian et al. | 55/62 |
| 4,169,486 | 10/1979 | Otteman et al. | 137/240 |
| 4,305,734 | 12/1981 | McGill | 55/62 |
| 4,383,547 | 5/1983 | Lorenz et al. | 137/240 |
| 4,539,020 | 9/1985 | Sakuraya et al. | 55/62 |
| 4,640,221 | 2/1987 | Barbee et al. | . |
| 4,699,805 | 10/1987 | Seelback et al. | . |
| 4,741,354 | 5/1988 | DeMild, Jr. | 137/240 |
| 4,869,301 | 9/1989 | Ohmi et al. | 137/240 |
| 4,892,615 | 1/1990 | Motta | . |
| 4,910,042 | 3/1990 | Hokynar | . |
| 4,917,136 | 4/1990 | Ohmi et al. | 137/240 |

Primary Examiner—George L. Walton
Attorney, Agent, or Firm—James C. Simmons; William F. Marsh

[57] ABSTRACT

Remote delivery system for potentially toxic moisture sensitive process gas to a point of use (e.g. CVD system).

5 Claims, 2 Drawing Sheets

DELIVERY OF REACTIVE GAS FROM GAS PAD TO PROCESS TOOL

FIELD OF THE INVENTION

This invention relates to the delivery of a reactive gas such as tungsten hexafluoride ($WF_6$) to a process tool such as a chemical vapor deposition (CVD) apparatus by means which permit the reactive gas supply to be located a considerable distance from the point of use.

BACKGROUND OF THE INVENTION

Currently in many CVD installations, the cylinders of reactive gas are located as close as possible to the process tool. This results in an unsafe work environment. Industry has experienced flow problems when locating the cylinders of tungsten hexafluoride more than 35 feet from the process tool possibly because of the tendency of $WF_6$ to react with any moisture it encounters, thereby forming an oxide which deposits in tubes in which the $WF_6$ is flowing. The flow rate required for the CVD process presently does not exceed 500 standard cubic centimeters per minute (sccm) of $WF_6$ delivered at the point of use. U.S. Pat. Nos. 4,640,221; 4,699,805 and 4,910,042 disclose and claim various systems for chemical vapor deposition (CVD) of thin coatings on a substrate, the '805 patent showing a CVD process for tungsten hexafluoride ($WF_6$). U.S. Pat. No. 4,892,615 discloses and claims a purging system for use with various semi-conductor manufacturing devices.

BRIEF SUMMARY OF THE INVENTION

The present invention permits the control equipment, e.g. (gas cabinet) and the cylinders from which the tungsten hexafluoride is dispensed to be located at a sufficient distance from the process tool so that safe working conditions can be maintained at the point of use.

In the present invention specialized equipment is incorporated in the gas delivery system to solve flow difficulties and handling problems associated with use of reactive gases such as tungsten hexafluoride. The major problem with tungsten hexafluroide is due to its rapid reaction with atmospheric contaminants such as moisture. Therefore in the gas delivery system of the present invention means are provided to remove all moisture from process flow components and, to prevent subsequent contamination of the process flow components by the atmosphere.

The present invention provides means whereby cylinders containing $WF_6$ or other reactive process gases may be located out of a service corridor at a safe site remote from the point of use, while still providing for the delivery of the process gas at flow rates which are required by the process.

The present invention also makes it possible to utilize off-the-shelf gas handling equipment in a standard process flow panel, suitably modified to allow the panel and the process gas supply cylinder to be located so that the safety of the workplace is not compromised.

According to the invention therein provided an apparatus which permits any desired flow of process gas from a supply source which is located a significant distance from the process tool.

DETAILED DESCRIPTION OF THE INVENTION

Three distinct subsystems are involved in the apparatus of the prior art and of the present invention, namely;

(1) a first subsystem for delivery process gas from a gas cylinder to a point of use;

(2) a second subsystem for delivering a purge gas to the first subsystem; and (3) a third subsystem to evacuate desired sections of the two subsystems so as to remove any moisture or other contaminants from them.

A typical process gas delivery system comprises the tubing and valves connecting a cylinder containing process gas at a pressure of 1 atmosphere or more for delivery to a work station where the process gas is to be used, e.g. in a CVD process.

Figure 1:
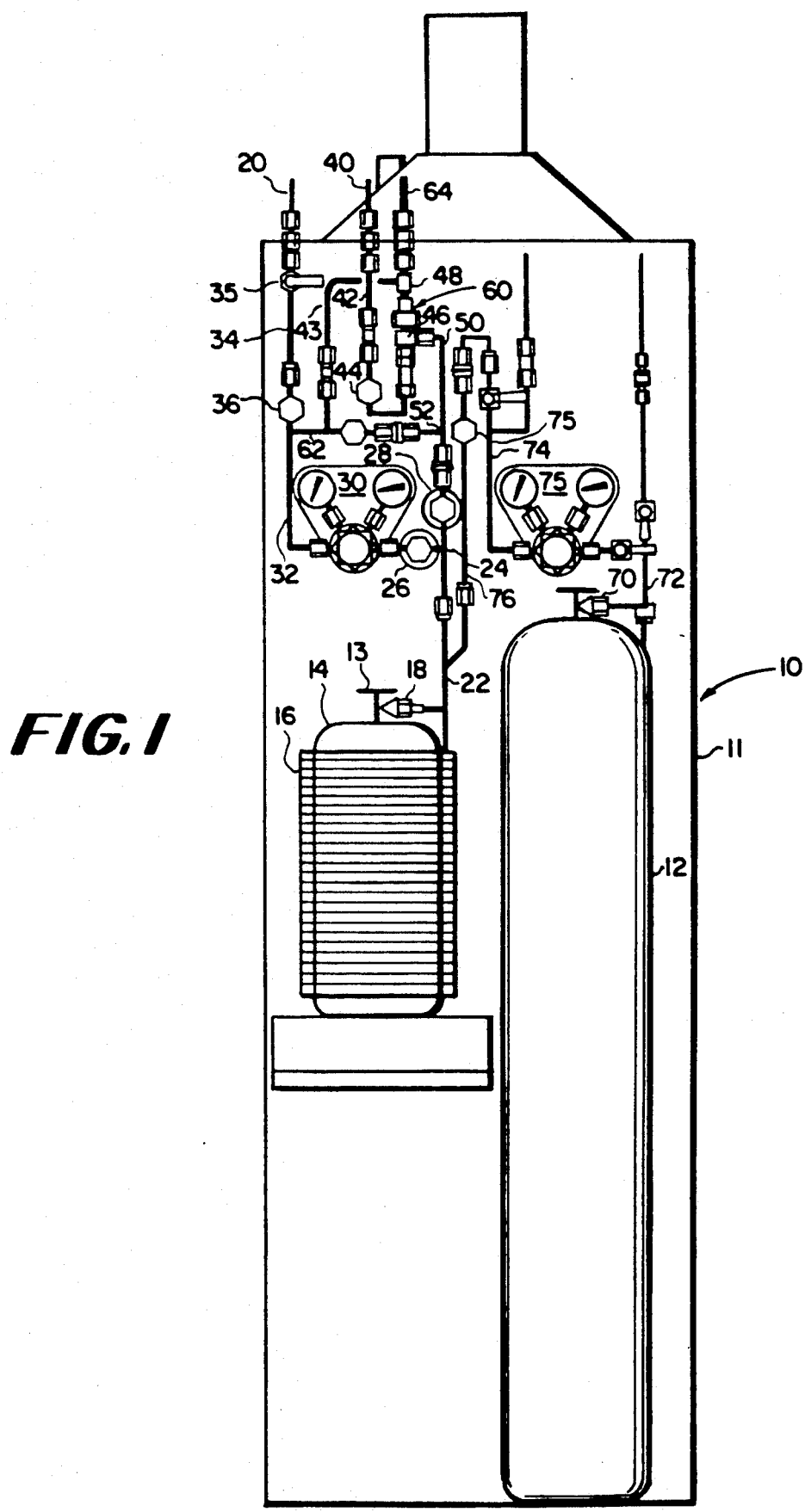
FIG. 1 is a front elevational view of a prior art $WF_6$ delivery system which is located close to the point of use.

As shown in FIG. 1 of the drawing a typical delivery system 10 can include a gas cabinet 11 which contains a cylinder 12 of a purge gas such as highly pure nitrogen or argon and a cylinder 14 of a process gas such as $WF_6$ at 1 atmosphere pressure. In the prior art installation shown in FIG. 1, a heating blanket 16 surrounds cylinder 14 to insure that the process gas does not condense on the walls of cylinder 14 or in the delivery system to which cylinder 14 is connected. Gas cylinder 14 is equipped with a pigtail connection 18 which has a 0.020 inch orifice which limits the flow of $WF_6$ to not more than 100 sccm.

Gas from cylinder 14 flows via intermediate conduits and connections to an outlet 20 at a point of use, e.g. a CVD apparatus (not shown) at which it is discharged at a pressure of about 1 mm Hg. Between the pigtail connection 18 and the point of use conduit 20 are a conduit 22, extending from the pigtail connection 18, a tee connection 24 one arm of which is connected to a process isolation valve 26 and another arm of which is connected to another process isolation valve 28. Process isolation valve 26 is connected to a pressure regulator 30 which is connected to an outlet conduit (line) 32 and thence to outlet conduit 20 through a process isolation valve 36 and an intermediate outlet line 34 which includes a shut off valve 35.

The purge gas subsystem comprises gas cylinder 12 which contains a highly pure inert gas such as nitrogen or argon, under pressure. The purge gas stored in cylinder 12 is connected to the process gas circuit through a pigtail 70 connecting cylinder 12 to conduit (line) 72 which in turn is connected to tube 74 through a pressure regulator 75 which acts as a safety which shuts the system down when there is insufficient pressure in cylinder 12. Purge gas line 74 is connected to process gas line 22 by way of piping 76 and valves therein, so that when a vacuum has been produced in the process gas delivery circuit, purge gas may be admitted to flush out any moisture or other contaminants.

Using a system such as shown in FIG. 1, the following procedure must be used when changing a cylinder 14 of process gas. The cylinder valve 13 on process cylinder 14 is closed. A source of $N_2$ (eq. 10–15 psia) is provided to the pigtail 18 via conduit 22 by opening valve 75 in conduit 76. Process valves 24 and 28 are closed. Pigtail connection 18 is loosened and disconnected allowing the $N_2$ to flow out of the 0.020 orifice in the pigtail 18 to the atmosphere. This $N_2$ flow helps to eliminate backstreaming of atmosphere contaminants into the pigtail 18. The used process cylinder 14 is removed from the cabinet 11 and a new process cylinder is placed in the cabinet and connected to pigtail connection 18. The pigtail is then purged of $N_2$ and other contaminants as discussed in the following paragraph.

Means for producing a vacuum are provided by an in-house supply of commercial nitrogen under pressure (not shown); which delivers gas to conduit 40 connected to conduit or pipe 42 provided with an isolation valve 44 and two "T" connections 46 and 48. Between tee 46 and tee 48 is a venturi 60. When nitrogen under pressure flows through the venturi 60 a pressure drop is created and the low pressure region of the venturi may then be connected to the process gas line 20 to produce a vacuum in that line. A branch conduit (line) 50 connects one arm of T 46 with a tee 52 which in turn is connected to the process gas line 20. One leg of T 46 is connected to process gas line 20 as described and another leg of T 46 is connected to a venturi 60 so that when house nitrogen is provided in this circuit and exhaust conduit 64 is opened to vent, nitrogen from cylinder 12 will flow through tube 74 T 46 and venturi 60 to produce a vacuum which can exhaust either the purge gas (nitrogen) circuit or the process gas circuit. A cross connection 62 connects T 52 with line 32. The process of evacuation and purging can be repeated as many times as necessary to produce a dry, evacuated system at low pressure (e.g. 200 mm Hg pressure) into which process gas may then be admitted enroute to the process tool. Suitable interlocks connect valves in both circuits as required for the system to function all of which are understood by a worker skilled in the art.

Figure 2:
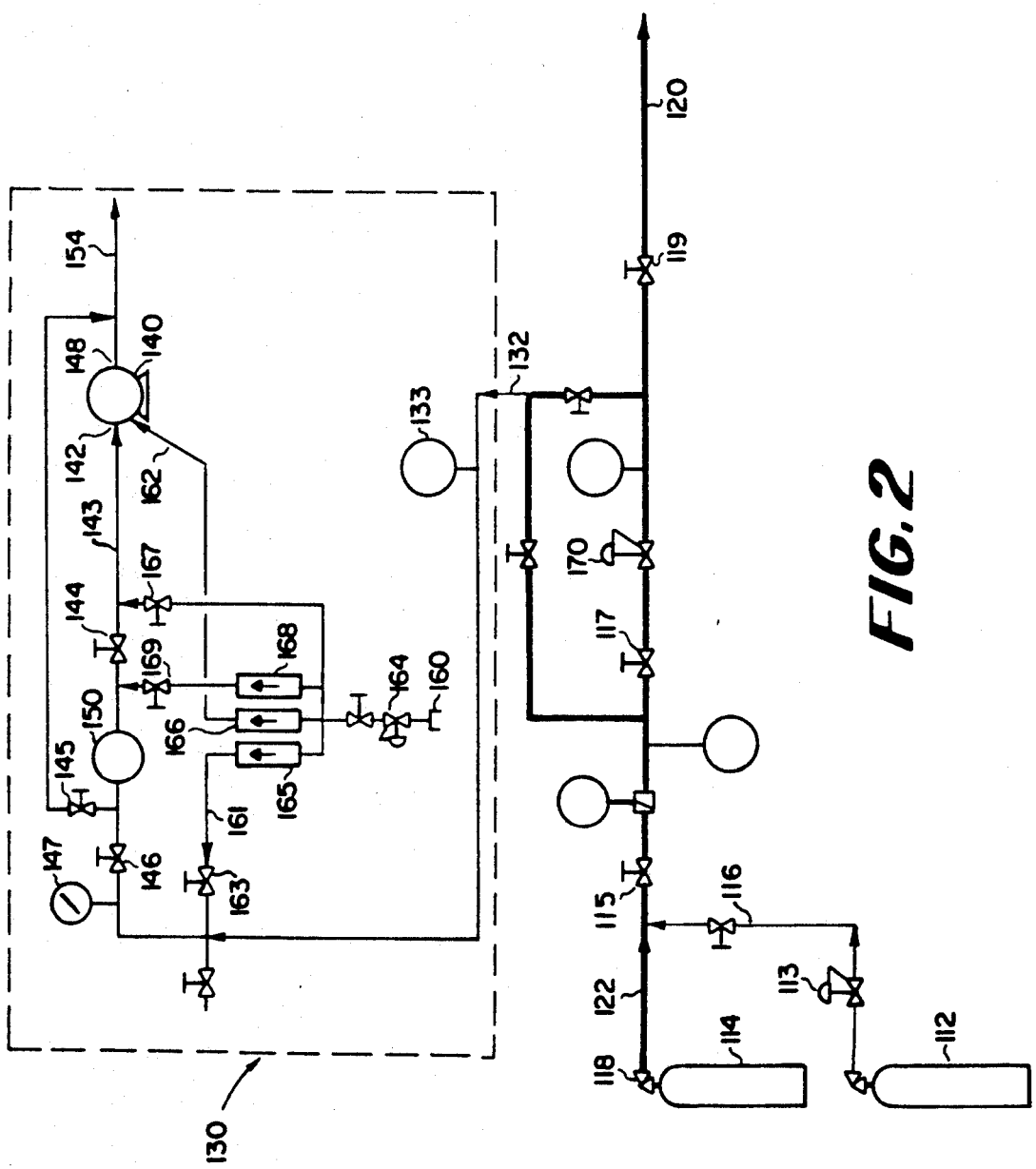
FIG. 2 is a schematic representation of a remotely located $WF_6$ delivery system according to the present invention.

FIG. 2 is a schematic of the system of the present invention. The systems for delivering the moisture sensitive gas ($WF_6$) and the purge gas (pure $N_2$) are substantially the same as those shown in FIG. 1, i.e. there are cylinders of process gas and purge gas in a gas cabinet with the necessary pigtail connections from connecting the cylinders with the cylinders with the delivery system. The system of the present invention which can be contained in a gas cabinet such as manufactured and sold by Air Products and Chemicals, Inc. supports one or more cylinders 112 of purge gas (e.g. nitrogen) and one or more cylinders 114 of process gas (e.g. $WF_6$). Process gas is delivered from a cylinder 114 through a pigtail valve 118 equipped with an 0.090 orifice to a ¼" stainless steel delivery tube 122 to a point of use 120. Purge gas (e.g. pure $N_2$) may be delivered from a tank 112 to purge gas delivery tube 116. As described in connection with FIG. 1 suitable valves 113, 115 are provided in tubes 116 and 122 respectively to regulate the delivery of either process gas or purge gas to the subsystems.

Line 122 is connected to an evacuation system 130 through a line 132 containing a pressure transducer 133. The evacuation system includes a pump 140 such as a two stage rotary vane type having an inlet 142 which is connected to line 132 through conduit 143, trap 150 which contains solid NaF whereby any $WF_6$ pulled into line 132 by the vacuum pump 140 may be scrubbed out of the system before it can reach the pump. Conduits 143 and 132 contain suitable shut off valves 144, 145, 146 and vacuum gage 147 to control and/or isolate the NaF trap 150 from the system. Outlet 148 of pump 140 exhausts through conduit 154 to a scrubber normally supplied by the user of the system according to the present invention.

In the present invention instead of utilizing a vacuum venturi in the process delivery panel to evacuate pigtail 118 during a cylinder change, this invention utilizes a mechanical vacuum pump 140 capable of achieving an ultimate pressure of 7 microns Hg with a perfluorinated oil. The pump has an inlet 142 and an exhaust 148. The vacuum system is provided with a small flow of nitrogen on the vacuum side of the pump 140, supplied from a source 160 (e.g. house nitrogen) connected to the pump case by a line 162 through a pressure control valve 164 and flow control 166 to remove atmospheric contaminants (e.g. oxygen) from the pump case. A small flow (e.g. 5 sccm) of nitrogen sufficient to reduce backstreaming of pump oil thus preventing contamination of the process tubing by pump oil is achieved by providing a conduit 161 and a flow control 165 and valve 163 between the source 160 and conduit 143 connected to inlet 142 of pump 140. Subsystem 130 achieves pressures of 100 microns Hg where it connects to the other subsystems. This pressure is 1000 times lower than that achievable with the previously used vacuum venturi 60 shown in FIG. 1. This lower pressure results in a marked improvement of purge efficiencies resulting in a lower number of purge cycles than required with the previously mentioned venturi. The lower number of purge cycles shortens the equipment down time.

The vacuum system is also equipped with a sodium fluoride (NaF) trap 150 in the pump inlet line which prevents tungsten hexafluoride ($WF_6$) from entering the pump. The sodium fluoride chemisorbs the tungsten hexafluoride at room temperature and is regenerable by heating to 250° C. and flowing 200-500 sccm of $N_2$ controlled through flow control device 168 and isolation valve 169.

In order to regenerate the adsorbent bed (sodium fluoride in trap 150) valve 163 is closed while valve 164 remains open. The flow through flowmeter 168 is adjusted so that nitrogen at the rate of 250 to 500 sccm flows into the trap 150 through valve 169 which is also open. At the same time, vacuum pump 148 continues to operate and the bed in trap 150 is heated to a temperature in excess of 200° C. (approximately 300° C.) while valve 144 is closed and valve 145 is open. At the end of the regeneration cycle, valves 145 and 169 are closed and valves 163 and 144 are open.

The vacuum pump 140 is interlocked through pressure valve control 167 connected to a source of 5 psig $N_2$ supplied from pressure control valve 164. Valve 164 will open if the vacuum pump fails, preventing suckback of oil into the vacuum sub-system.

The process isolation valves 115, 117, 119 in the subsystems for delivery purge gas and process gas have been selected with large flow coefficients ($C_v$). $C_v$ valves below 0.15 can cause difficulty in achieving the desired tungsten hexafluoride flow rates. Typical prior art gas cabinets use process isolation valves with $C_v$ of 0.08.

The process flow isolation valves used in the present invention have no elastomer seals. These valves are a diaphram type, and are sealed with a metal-to-metal seats on the valve body. Elastomers are avoided in this system because tungsten hexafluoride reacts with the adsorbed water inside the elastomers creating tungsten oxides "tungsten blues" and tungsten oxyfluorides that could potentially clog the flow components. It was also found that tungsten hexafluoride swells elastomers which can also contribute to clogged flow components.

The delivery system shown in FIG. 2 also utilizes an absolute pressure regulator 170 ($C_v=0.30$) to drop the pressure of the tungsten hexafluoride on the delivery side to a pressure below the saturation pressure at the temperature of the ambient surroundings. The pressure regulator has only a small KEL-F elastomer which seals the poppet. Prior art systems did not use an absolute pressure regulator, therefore the delivery pressure was above the saturation point of the $WF_6$. Thus if the delivery pressure was set above the saturation point of the lowest temperature in the delivery conduit to the work station or tool, the $WF_6$ would condense.

In the pigtail cylinder connection 118 there is a 0.090 inch orifice which acts as a critical flow element during cylinder changes. This orifice inhibits backstreaming of atmospheric contaminants into the pigtail during the cylinder change. During a cylinder change a 25 psig or greater pressure drop to atmosphere is maintained by ultra high purity Nitrogen flowing out the end of the pigtail. This pressure drop keeps the linear flow of the Nitrogen greater than 400 feet/sec, the linear velocity at which backstreaming of the atmospheric contaminants, i.e., moisture, is impeded. In prior art devices only minimal flow of $N_2$ is allowed (e.g. less than 100 feet/sec. linear velocity).

Fluorine passivation is used on all process flow components after system installation. A 5% $F_2$/95% $N_2$ mix is used to passivate the flow components. The system is then evacuated and refilled with the mix at 20 psig for 20 minutes. The system is then evacuated and refilled with the mix at 20 psig for a minimum of 12 hours. The system is evacuated and purged with nitrogen to remove the mix. This fluorine passivation creates a passive fluoride film which protects the process flow components most of which are made of stainless steel.

For a ¼ inch stainless steel tubing with 0.035 wall thickness tungsten hexafluoride can be delivered 350 feet at a pressure drop of 125 torr. Utilizing the equation for compressible flow, the calculated maximum length of ¼ inch tubing at a flow rate of tungsten hexafluoride of 500 sccm and a maximum pressure drop of 250 torr will not be more than 800 feet.

At a distance of 800 feet, if the pressure drop between the cylinder and tool is less than 250 torr the flow of tungsten hexafluoride will fall below 500 sccm. At distances below 800 feet the corresponding pressure drop to maintain 500 sccm of flow will decrease as predicted by the equation for compressible flow.

It should be noted that each installation will have its own unique set of tubing bends and valves and therefore a unique system frictional coefficient. This variability in system frictional coefficient will result in different pressure drops to maintain the 500 sccm flow of taungsten hexafluoride.

Having thus described my invention what is desired to be secured by Letters Patent of the United States is set forth in the following claims.

I claim:

1. In a system for delivery a potentially toxic moisture sensitive process gas to a tool at a point of use located a substantial distance from a source of supply of said process gas which includes:

a source of supply of said process gas;

process gas delivery means including means such as a pigtail for connecting said supply of process gas to a point of use through a conduit, said pigtail having a delivery orifice sized to allow the required flow of process gas while eliminating reverse diffusion of atmospheric gases during changing of the source of supply of process gas and means to deliver said process gas at a pressure below its saturation pressure at ambient temperature;

a source of supply of purge gas;

means connecting said purge gas to said conduit; and means to evacuate said conduit of residual process gas when said source of process gas is removed from said system said evacuation means comprising in combination a vacuum pump having a pump case, the inlet of which is connected through a trap containing a protective adsorbent capable of removing process gas prior to entering said pump, said conduit and said vacuum pump adapted to withdraw process gas from said means to supply process gas to said point of use when said process gas source is removed from the system, said vacuum pump having a pump case purge to strip atmospheric contaminates from the pump oil and to prevent backstreaming of gaseous pump oil to the pigtail.

2. The system of claim 1 wherein the process gas is $WF_6$ and the trap contains NaF as the protective adsorbent.

3. The system of claim 1 including means to passivate said system, prior to use.

4. A system according to claim 1 for delivering a moisture senitive gas from a source of supply wherein the gas is stored at a pressure of at least 1 atmosphere to a point of use where the gas is delivered at a pressure of approximately 20 mmHg.

5. The system of claim 1 whherein said pump is a mechanical pump capable of achieving an ultimate pressure of 7 microns Hg with a perfluorinated oil, said pump including means to admit a small amount of inert gas into the case of said pump, said gas being at a flow rate to remove atmospheric contaminants from the pump case.

* * * * *